(12) United States Patent
Jeon et al.

(10) Patent No.: US 9,035,910 B2
(45) Date of Patent: May 19, 2015

(54) TOUCH SENSING AND REMOTE SENSING OPTICAL TOUCH SCREEN APPARATUSES

(75) Inventors: Sang-hun Jeon, Seoul (KR); I-hun Song, Gyeonggi-do (KR); Seung-eon Ahn, Gyeonggi-do (KR); Young Kim, Yongin-si (KR); Chang-jung Kim, Yongin-si (KR); Yong-woo Jeon, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 169 days.

(21) Appl. No.: 13/434,164

(22) Filed: Mar. 29, 2012

(65) Prior Publication Data

US 2013/0050148 A1  Feb. 28, 2013

(30) Foreign Application Priority Data

Aug. 29, 2011 (KR) .................. 10-2011-0086562

(51) Int. Cl.
*G06F 3/042* (2006.01)
*G06F 3/038* (2013.01)
*H01L 27/146* (2006.01)

(52) U.S. Cl.
CPC .............. *G06F 3/042* (2013.01); *G06F 3/0386* (2013.01); *H01L 27/14679* (2013.01)

(58) Field of Classification Search
CPC .............. G09G 2360/142; G06F 2203/04106; G06F 2203/04109
USPC .................................................. 345/173, 175
See application file for complete search history.

(56) References Cited

U.S. PATENT DOCUMENTS

| 7,629,610 B2 * | 12/2009 | Yamazaki et al. ............... 257/59 |
| 2007/0268206 A1 * | 11/2007 | Kinoshita et al. ............... 345/30 |
| 2008/0198143 A1 | 8/2008 | Kinoshita et al. |
| 2011/0069020 A1 | 3/2011 | Kim et al. |
| 2011/0122098 A1 | 5/2011 | Kurokawa |

FOREIGN PATENT DOCUMENTS

| CN | 101900899 A | 12/2010 |
| JP | 11119910 A | 4/1999 |
| JP | 2001292276 A | 10/2001 |

(Continued)

OTHER PUBLICATIONS

Mayer, M. et al., "Band structure engineering of ZnO 1-x Se x alloys," Applied Physics Letters 97, 2010.

(Continued)

*Primary Examiner* — Sahlu Okebato
(74) *Attorney, Agent, or Firm* — Harness, Dickey & Pierce, P.L.C.

(57) ABSTRACT

Optical touch screen apparatuses with remote sensing and touch sensing by using a light sensor transistor including an oxide semiconductor transistor. The optical touch screen apparatus includes a pixel array of a plurality of sensing pixels arranged in a plurality of rows and a plurality of columns. Each of the sensing pixels includes a light sensing pixel for sensing light that is irradiated by an external light source and a touch sensing pixel for sensing display light that is reflected by a screen touch. The light sensing pixel includes a first light sensor transistor and a first switch transistor connected each other in series, and the touch sensing pixel includes a second light sensor transistor and a second switch transistor connected each other in series.

26 Claims, 7 Drawing Sheets

(56) References Cited

FOREIGN PATENT DOCUMENTS

| | | |
|---|---|---|
| KR | 20080014683 A | 4/2008 |
| KR | 20090006543 A | 1/2009 |
| KR | 20090038822 A | 4/2009 |
| KR | 20100095951 A | 9/2010 |
| KR | 1020120060602 | 6/2012 |
| KR | 1020120062284 | 6/2012 |
| KR | 1020120120707 | 11/2012 |
| KR | 1020120124225 | 11/2012 |
| WO | WO-2005/081810 A3 | 9/2005 |

OTHER PUBLICATIONS

Zhao, G. et al., "Graded bandgap semiconductor thin film photoelectrodes," Chinese Science Bulletin, vol. 46, No. 11, pp. 914-915, Jun. 2001.

Extended European Search Report dated Sep. 30, 2014.

* cited by examiner

TOUCH SENSING AND REMOTE SENSING OPTICAL TOUCH SCREEN APPARATUSES

CROSS-REFERENCE TO RELATED APPLICATION

This application claims the benefit of Korean Patent Application No. 10-2011-0086562, filed on Aug. 29, 2011, in the Korean Intellectual Property Office, the disclosure of which is incorporated herein in its entirety by reference.

BACKGROUND

1. Field

Example embodiments relate to touch sensing and remote sensing optical touch screen apparatuses.

2. Description of the Related Art

A touch screen apparatus directly receives input data from a display screen. The touch screen executes software functions based on locations of the display screen that are touched by the finger or stylus of a user. Generally, a touch screen apparatus is formed by adding a touch panel to a common display panel. Examples of touch panels include resistance film touch panel, electrostatic capacitance touch panel, surface acoustic wave (SAW) touch panel, infrared ray touch panel, piezoelectric touch panel, etc. Recently, such touch screen apparatuses are widely used in various fields as input devices to replace keyboards or mice.

A general touch screen apparatus requires a direct touch on a display screen by a finger or a pen. However, as the size of a display apparatus increases, if a distance between a user and a display apparatus increases, it may be difficult to directly touch the touch screen. An optical touch screen apparatus may perform the same functions as a conventional touch screen apparatus by sensing light instead of touch by a finger or a pen. An optical touch screen apparatus may be useful not only for communication between a user and an apparatus but also for communication between users.

To embody an optical touch screen apparatus, fine-sized light-sensing devices for sensing light are used. An example of generally used light-sensing devices includes an amorphous silicon thin-film transistor (a-Si TFT). However, in a case of an a-Si TFT, the change in current due to light is insufficiently large. Therefore, charges generated by a photodiode during the application of light are accumulated in a capacitor for a predetermined period of time and a signal related to light intensity is generated based on the amount of charges accumulated in the capacitor. In this case, a sensing time may be delayed by as much as a period of time for accumulating charges in the capacitor, and parasitic capacitance may increase as the size of an optical touch screen apparatus increases.

SUMMARY

Remote sensing and touch sensing optical touch screen apparatuses including light sensor transistors, for example, oxide semiconductor transistors, are provided.

According to at least one example embodiment, an optical touch screen apparatus includes a plurality of sensing pixels arranged in a plurality of rows and a plurality of columns. Each of the sensing pixels may include a light sensing pixel for sensing light that may be irradiated by an external light source and a touch sensing pixel for sensing display light that may be reflected by a screen touch. The light sensing pixel may include a first light sensor transistor and a first switch transistor connected to each other in series, and the touch sensing pixel may include a second light sensor transistor and a second switch transistor connected each other in series.

For example, the light sensing pixels and the touch sensing pixels may be alternately arranged in a row direction. The optical touch screen apparatus may further include a first gate line connected to a gate of the first switch transistor of the light sensing pixel, a first reset line connected to a gate of the first light sensor transistor of the light sensing pixel, a second gate line connected to a gate of the second switch transistor of the touch sensing pixel, and a second reset line connected to a gate of the second light sensor transistor of the touch sensing pixel. According to an example embodiment, the optical touch screen apparatus may further include a data line that may be commonly connected to a source of the first switch transistor of the light sensing pixel and a source of the second switch transistor of the touch sensing pixel.

According to at least one other example embodiment, the optical touch screen apparatus may further include a first data line that may be connected to a source of the first switch transistor of the light sensing pixel and a second data line that may be connected to a source of the second switch transistor of the touch sensing pixel. According to at least one example embodiment, the first reset line may be disposed between the gate of the first light sensor transistor arranged in a row and the second gate line in a subsequent row, and the second reset line may be disposed between the gate of the second light sensor transistor arranged in a row and the first gate line in a subsequent row. According to at least one example embodiment, the first light sensor transistor and the second light sensor transistor may be oxide semiconductor transistors that sense different wavelength bands of light.

For example, the first light sensor transistor may be configured to sense a first wavelength band of light and the second light sensor transistor may be configured to sense a second wavelength band of light. The first wavelength band may be longer than the second wavelength band. For example, the first wavelength band may include at least one band of the group consisting of green, blue, and ultraviolet bands, and the second wavelength band may include at least one band of the group consisting of red and infra-red bands. According to at least one other example embodiment, the first light sensor transistor and the second light sensor transistor may be oxide semiconductor transistors that sense the same wavelength band of light.

According to at least one further example embodiment, an optical touch screen apparatus includes a plurality of display pixels and a plurality of sensing pixels arranged in a plurality of rows and a plurality of columns. Each of the sensing pixels may include a light sensing pixel for sensing light that may be irradiated by an external light source and a touch sensing pixel for sensing display light that may be reflected by a screen touch. The light sensing pixel may be a first light sensor transistor and a first switch transistor connected each other in series, and the touch sensing pixel may include a second light sensor transistor and a second switch transistor connected each other in series, and each of the display pixels may include a display cell and a third switch transistor for controlling ON/OFF of the display cell.

For example, the display pixels may be arranged in a row direction, and the light sensing pixel and the touch sensing pixel may be disposed adjacent to corresponding display pixels, respectively. The optical touch screen apparatus may further include a first gate line that may be connected to a gate of the first switch transistor of the light sensing pixel and a gate of the third switch transistor of the display pixel, a first reset line that may be connected to a gate of the first light sensor transistor of the light sensing pixel, a second gate line that may be connected to a gate of the second switch transistor of the touch sensing pixel and the gate of the third switch transistor of the display pixel, and a second reset line connected to a gate of the second light sensor transistor of the touch sensing pixel. The optical touch screen apparatus may further include an image data line connected to a drain of the third switch transistor of the display pixel, and the display cell may be connected to a source of the third switch transistor.

According to at least one example embodiment, an optical touch screen apparatus includes a plurality of sensing pixels in a plurality of rows and a plurality of columns, each of the sensing pixels including a light sensing pixel configured to sense light, the light sensing pixel including a first light sensor transistor and a first switch transistor connected in series, and a touch sensing pixel configured to sense light, the touch sensing pixel including a second light sensor transistor and a second switch transistor connected in series.

According to at least one example embodiment, an optical touch screen apparatus includes a plurality of sensing pixels in a plurality of rows and a plurality of columns, each of the sensing pixels including a light sensing pixel configured to sense light, the light sensing pixel including a first light sensor transistor and a first switch transistor connected in series, and a touch sensing pixel configured to sense light, the touch sensing pixel including a second light sensor transistor and a second switch transistor connected in series, and a plurality of display pixels arranged in the plurality of rows and the plurality of columns, each of the display pixels including a display cell and a third switch transistor for controlling ON/OFF of the display cell.

According to at least one example embodiment, an optical touch screen apparatus includes a first oxide semiconductor thin film transistor (TFT) including a first oxide semiconductor material with sensitivity to a first spectrum of light, and a second oxide semiconductor TFT including a second oxide semiconductor with sensitivity to a second spectrum of light, the second spectrum being different from the first spectrum.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

FIG. 1 is a schematic cross-sectional diagram illustrating oxide semiconductor transistors according to example embodiments;

FIGS. 2 and 3 are graphs illustrating operational characteristics of an oxide semiconductor transistor of FIG. 1;

FIG. 4 is a circuit diagram illustrating sensing pixels of optical touch screen apparatuses including oxide semiconductor transistors of FIG. 1 according to at least one example embodiment;

FIG. 5 is a circuit diagram illustrating sensing pixels of optical touch screen apparatuses according to at least one example embodiment;

FIG. 8 is a schematic conceptual view illustrating overall operations of optical touch screen apparatuses according to at least one example embodiment;

FIG. 9 is a circuit diagram illustrating in-cell type optical touch screen apparatus pixel arrays according to at least one example embodiment; and FIG. 10 is a circuit diagram illustrating in-cell type optical touch screen apparatus pixel arrays according to at least one other example embodiment.

Figure 1:
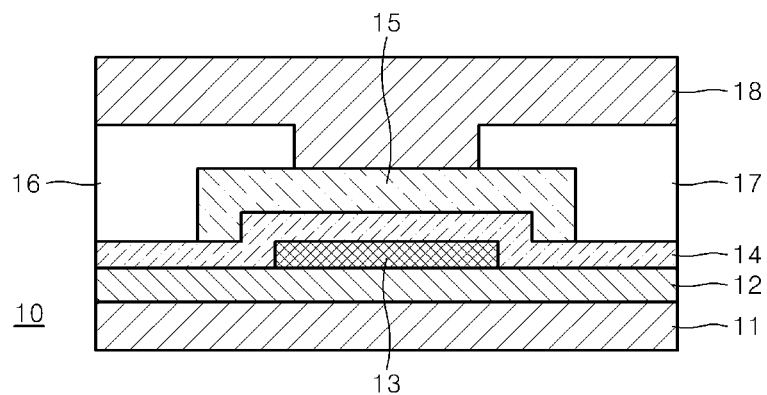

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

An oxide semiconductor transistor is a transistor including a channel formed of an oxide semiconductor. The oxide semiconductor transistor may be sensitive to light according to an oxide semiconductor material of the channel layer. In a case where a channel layer is formed of an oxide semiconductor sensitive to light, the threshold voltage and drain current of the oxide semiconductor transistor may change according to the wavelength or intensity of incident light, and thus the oxide semiconductor transistor may be used as a light-sensing device.

FIG. 1 is a schematic sectional diagram illustrating oxide semiconductor transistors 10 according to example embodiments. Referring to FIG. 1, an oxide semiconductor transistor 10 may include a substrate 11, an insulation layer 12, a gate 13, a gate insulation layer 14, a channel layer 15, a source 16, a drain 17 and a transparent insulation layer 18. The insulation layer 12 may be on the substrate 11 and may cover the substrate 11. The gate 13 may be on a portion of the insulation layer 12. The gate insulation layer 14 may be on the insulation layer 12 and the gate 13, and may cover the surroundings of the gate 13. The channel layer 15 may be on the gate insulation layer 14 and may face the gate 13. The source 16 and the drain 17 may be on opposite ends of the channel layer 15. The transparent insulation layer 18 may cover the source 16, the drain 17, and the channel layer 15. Although FIG. 1 illustrates a bottom-gate type oxide semiconductor transistor 10 in which the gate 13 may be below the channel layer 15, example embodiments are not so limited, and an oxide semiconductor transistor 10 may also be a top-gate structure.

The substrate 11 may include common substrate materials, for example, glass and/or silicon. The insulation layer 12, the gate insulation layer 14, and the transparent insulation layer 18 may be formed of $SiO_2$, for example. If the substrate 11 includes an insulation material, the insulation layer 12 may not be included. The gate 13, the source 16, and the drain 17 may include, for example, a conductive metal and/or a conductive metal oxide. For example, if the oxide semiconductor transistor 10 is transparent, the gate 13, the source 16, and the drain 17 may include a transparent conductive material (e.g., indium tin oxide (ITO)). If the oxide semiconductor transistor 10 is not transparent, the substrate 11, the insulation layer 12, the gate 13, the gate insulation layer 14, the source 16, and the drain 17 may not include transparent materials.

The channel layer 15 may be, for example, an oxide semiconductor material. According to oxide semiconductor materials that may constitute the channel layer 15, the oxide semiconductor transistor 10 may be light sensitive. An oxide semiconductor material of the channel may include any oxide semiconductor, for example, ZnO, InO, SnO, InZnO, ZnSnO, and/or InSnO. The oxide semiconductor material of the channel layer 15 may be mixed with hafnium (Hf), zirconium (Zr), titanium (Ti), tantalum (Ta), gallium (Ga), niobium (Nb), vanadium (V), aluminum (Al), and/or tin (Sn). In a case where any of such materials may constitute the channel layer 15, the threshold voltage and drain current of the oxide semiconductor transistor 10 of FIG. 1 may change according to the wavelength and/or intensity of incident light. The oxide semiconductor transistor 10 may be used as a light-sensing device. According to the type of an oxide semiconductor used in the channel layer 15, light that may be sensed by the oxide semiconductor transistor 10 may vary. The channel layer 15 may include a single oxide semiconductor layer and/or may be a multi-layer structure.

Figure 2:
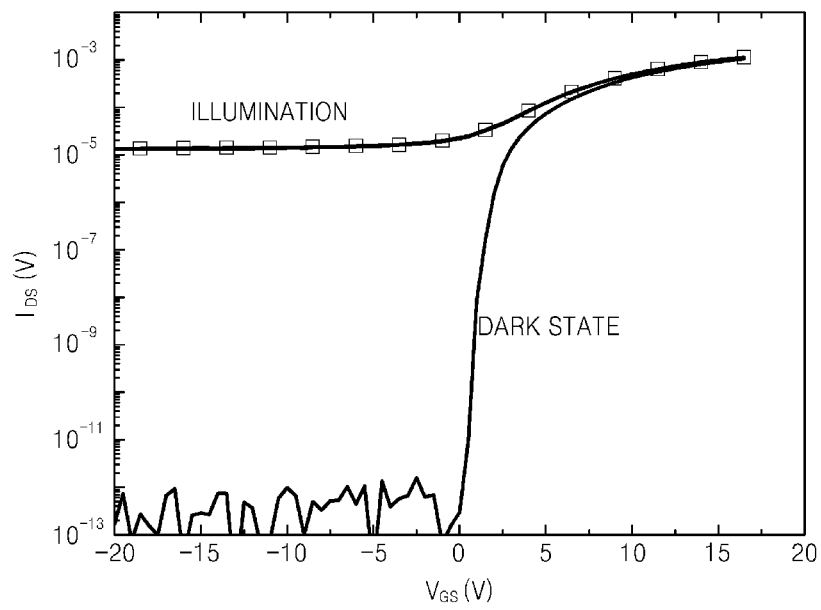
Figure 3:
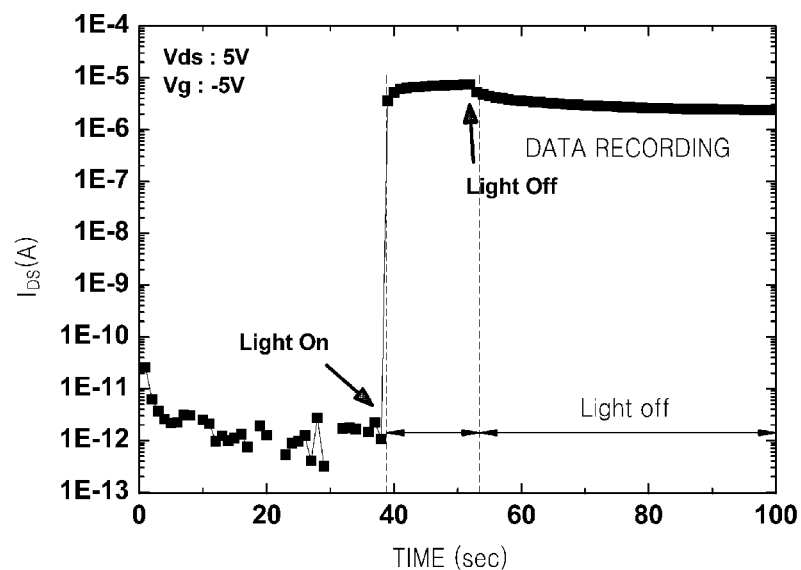

FIGS. 2 and 3 are graphs illustrating operational characteristics of an oxide semiconductor transistor 10 of FIG. 1. FIG. 2 is a graph of drain current (Ids) as a function of gate voltage (Vgs) for an oxide semiconductor transistor 10. Referring to FIG. 2, an off-drain current of the oxide semiconductor transistor 10 may increase when light is incident on the oxide semiconductor transistor 10. For example, when a gate voltage that is greater than a threshold voltage is applied to the oxide semiconductor transistor 10, as illustrated on the right side of the graph of FIG. 2, a drain current when light is incident is almost identical to a drain current when light is not incident. When a gate voltage that is lower than a threshold voltage is applied to the oxide semiconductor transistor 10, as shown in the left side of the graph of FIG. 2, a drain current when light is incident may be greater than a drain current when light is not incident.

In a state in which a gate voltage that is lower than a threshold voltage is applied to the oxide semiconductor transistor 10, whether light is incident may be confirmed by measuring a drain current. In a case of an oxide semiconductor transistor 10, a current ratio $I_{ON}/I_{OFF}$ between a drain current when light is incident and a drain current when no light is incident may be fairly large. Because a current ratio of the oxide semiconductor transistor 10 is large, if the oxide semiconductor transistor 10 is used as a light sensing device, the light sensing device may not include a capacitor and may be simple.

FIG. 3 is a graph of drain current over time after light is incident on the oxide semiconductor transistor 10. Referring to FIG. 3, light may be incident on the oxide semiconductor transistor 10 for about 40 seconds and the drain current may increase. According to example embodiments, even if the incidence of light may be stopped around 55 seconds, the drain current may barely decrease. This phenomenon may be caused as charges are trapped within or on an interface of the channel layer 15 of the oxide semiconductor transistor 10. For example, a negative gate voltage may be applied to the oxide semiconductor transistor 10 together with light, holes may be generated in the channel layer 15 by the light and may move to the interface between the gate insulation layer 14 and the channel layer 15 and may be trapped. The trapped charges may not be removed until a sufficiently large voltage is applied to a gate of the oxide semiconductor transistor 10. Once charges are trapped, drain current may not decrease even if the incidence of light is stopped. This phenomenon may disappear when trapped charges are removed by applying a sufficiently large gate voltage to the oxide semiconductor transistor 10.

Figure 4:
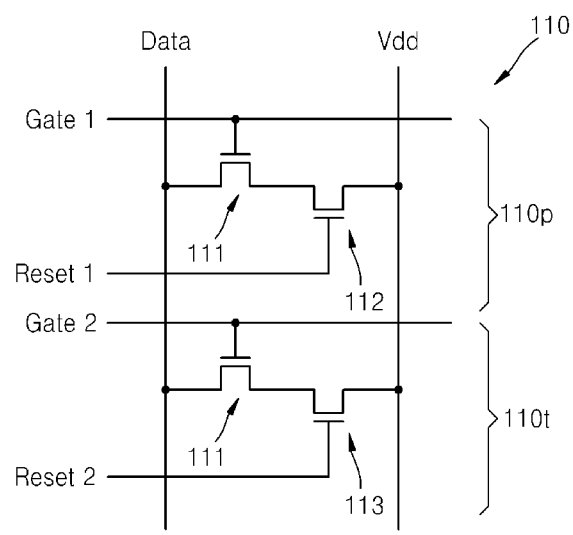

FIG. 4 is a circuit diagram illustrating sensing pixels 110 of optical touch screen apparatuses including oxide semiconductor transistors 10 according to at least one example embodiment. Referring to FIG. 4, a sensing pixel 110 of an optical touch screen apparatus may include a light sensing pixel 110p to sense light that may be irradiated from an external light source and a touch sensing pixel 110t to sense a display light that may be reflected when a screen is touched. Although in FIG. 4, only one light sensing pixel 110p and one touch sensing pixel 110t are illustrated, a plurality of sensing pixels 110 may be aligned in a plurality of rows and columns (e.g., an array). For example, a plurality of light sensing pixels 110p and a plurality of touch sensing pixels 110t may be alternately aligned in a row direction.

The light sensing pixel 110p may include a first light sensor transistor 112 and a switch transistor 111 that are connected in series. For example, a source of the first light sensor transistor 112 may be connected to a drain of the switch transistor 111. The first light sensor transistor 112 may be a light sensing device for sensing light and may be, for example, an oxide semiconductor transistor 10. The switch transistor 111 for outputting a light sensing signal may be a general thin-film transistor (TFT) with no light sensitivity. The sensing pixel 110 may include a first gate line Gate 1 connected to a gate of the switch transistor 111, a data line Data that may be connected to a source of the switch transistor 111, a driving voltage line Vdd that may be connected to a drain of the light sensor transistor 112, and a reset line Reset 1 that may be connected to a gate of the light sensor transistor 112.

In a light sensing pixel 110, a gate voltage may be applied to the switch transistor 111 via the first gate line Gate 1 and the switch transistor 111 may be turned ON. A current may flow from the source of the first light sensor transistor 112 to the data line Data. The amount of current flowing from the first light sensor transistor 112 to the data line Data may change according to the intensity of light incident on the first light sensor transistor 112. The intensity of light incident on the first light sensor transistor 112 may be calculated by measuring the amount of current flowing through the data line Data. While the switch transistor 111 is ON to output a light sensing signal, a voltage that is lower than a threshold voltage may be applied to the gate of the first light sensor transistor 112. While no gate voltage is applied to the switch transistor 111, the switch transistor 111 may be turned OFF, and no current may flow in the data line Data. The light sensing signal may be output from the light sensing pixel 110p by controlling the switch transistor 111. The incidence of light on the first light sensor transistor 112 and the intensity of the light may be determined based on the amplitude of the light sensing signal.

Figure 6A:
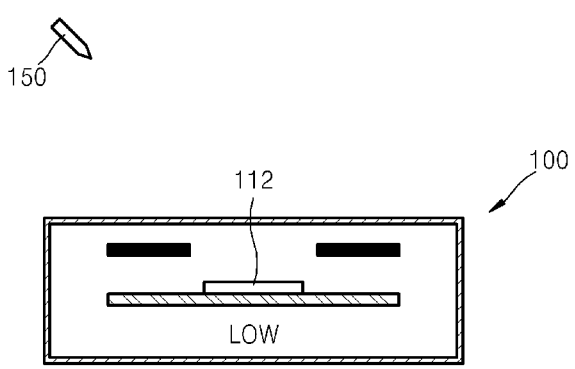
FIGS. 6A and 6B illustrate remote light sensing operations of optical touch screen apparatuses according to at least one example embodiment.
Figure 6B:
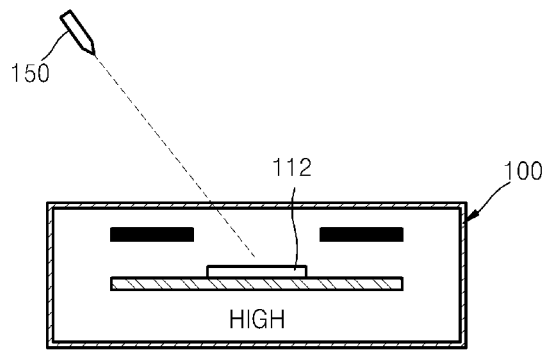

FIGS. 6A and 6B illustrate remote light sensing operations of optical touch screen apparatuses 100 according to at least one example embodiment. An optical touch screen apparatus 100 may include only the first light sensor transistor 112 for ease of description. However, an array of the sensing pixels 110 of FIG. 4 and a driving circuit for driving the sensing pixels 110 may be included in the optical touch screen apparatus 100. Referring to FIG. 6A, for example, while light is not emitted from a light source device 150 (e.g., a laser pointer) and light may not be incident on the first light sensor transistor 112. A drain current of the first light sensor transistor 112 may be a low drain current and current may barely flow to the data line Data (LOW).

As illustrated in FIG. 6B, light emitted from the light source device 150 may be incident on the first light sensor transistor 112 and the drain current of the first light sensor transistor 112 may increase according to the intensity of the incident light. The increased current may flow to the data line Data (HIGH). The light source device 150 may emit light having a relatively short wavelength band, for example, green light, blue light, and/or ultraviolet (UV) light, and in this case, the first light sensor transistor 112 may be highly sensitive to green, blue, and/or UV spectrums of light. The sensing wavelength of the first light sensor transistor 112 may be determined according to, for example, an oxide semiconductor material used in the channel layer 15.

Referring to FIG. 4, after light is measured using the light sensing pixel 110p, a reset process may be performed by applying a positive (+) reset signal to the first light sensor transistor 112 to remove trapped charges in order to perform a next measurement accurately. A first reset line Reset 1 connected to a gate of the first light sensor transistor 112 may be a line through which a positive (+) voltage is applied to reset the first light sensor transistor 112 and facilitate performance of a next measurement. For example, after a gate voltage is applied to the switch transistor 111 via the first gate line Gate 1, a reset signal with a sufficiently high positive (+) charge may be transmitted to the gate of the first light sensor transistor 112 via the first reset line Reset 1 to reset the first light sensor transistor 112.

The structure and operation of the touch sensing pixel 110t may be almost identical to those of the light sensing pixel 110p, except for a wavelength band of sensed light. Referring to FIG. 4, the touch sensing pixel 110t may include a second light sensor transistor 113 and a switch transistor 111 connected in series. The switch transistor 111 of the touch sensing pixel 110t may be the same as the switch transistor 111 of the light sensing pixel 110p, except that a second gate line Gate 2 may be connected to a gate of the switch transistor 111. The second light sensor transistor 113 may be highly sensitive to light with a relatively long wavelength band, for example, red and/or infra-red (IR) light, by appropriately selecting an oxide semiconductor material of the channel layer 15. A gate of the second light sensor transistor 113 may be connected to a second reset line Reset 2.

Figure 7A:
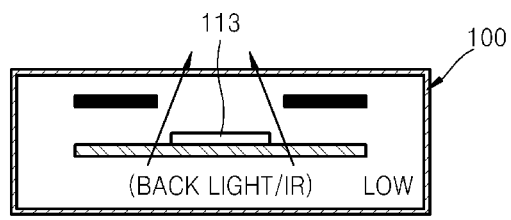
FIGS. 7A and 7B illustrate touch sensing operations of optical touch screen apparatuses according to at least one example embodiment.
Figure 7B:
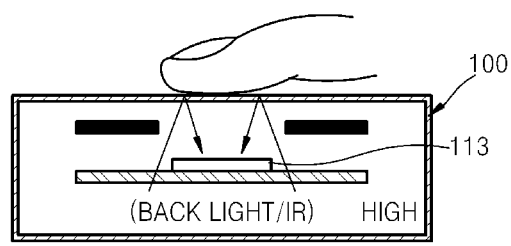

FIGS. 7A and 7B illustrate touch sensing operations of optical touch screen apparatuses 100 according to at least one example embodiment. Referring to FIGS. 7A and 7B, an optical touch screen apparatus 100 may include only the second light sensor transistor 113 for ease of description.

However, the optical touch screen apparatus 100 may include, for example, an array including a plurality of sensing pixels 110 and a driving circuit. Referring to FIG. 7A, light for displaying an image (hereinafter referred to as a display light) may pass through the optical touch screen apparatus 100. In a case of a liquid crystal display, the display light may be, for example, backlight. In a case of an organic light-emitting display, the display light may be, for example, light that is emitted from a display pixel.

If a finger of a user and/or a pen does not contact the touch sensing pixel 110t, the display light may pass through the optical touch screen apparatus 100 and may fail to reach the second light sensor transistor 113. A drain current of the second light sensor transistor 113 may be low and may not flow to the data line Data (LOW). Referring to FIG. 7B, if a finger of a user and/or a pen contacts the touch sensing pixel 110t, the display light may be reflected by the user's finger or pen and may be incident on the second light sensor transistor 113. The drain current of the second light sensor transistor 113 may increase and may flow to the data line Data (HIGH).

If the second light sensor transistor 113 is highly sensitive to IR light, a backlight unit may include, for example, an IR light source for emitting IR light. If a display device coupled to the optical touch screen apparatus 100 may be an organic light-emitting display, the organic light-emitting display may include a pixel that generates IR light. By differentiating a wavelength of light sensed by the first light sensor transistor 112 of the light sensing pixel 110p and a wavelength of light that may be sensed by the second light sensor transistor 113 of the touch sensing pixel 110t, it is possible to distinguish remote light sensing by irradiation of external light and touch sensing by direct touching (e.g., in a single device).

Figure 8:
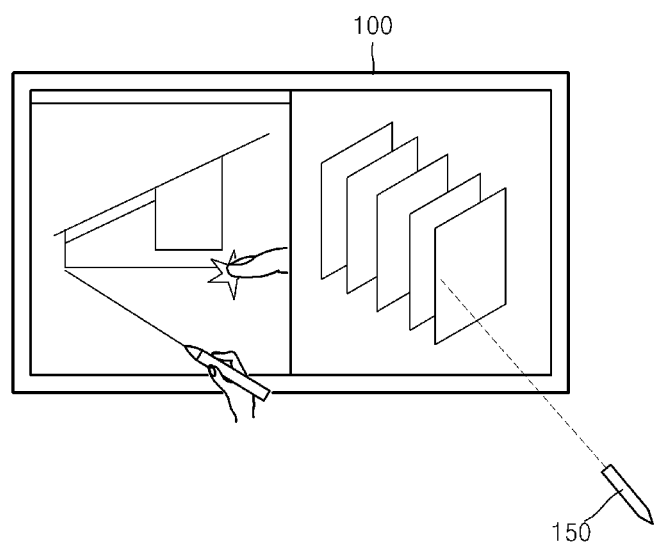

An optical touch screen apparatus 100 according to example embodiments may perform both remote sensing and touch sensing by using the first and second light sensor transistors 112 and 113 each including an oxide semiconductor transistor. As illustrated in FIG. 8, if a user is located far from the optical touch screen apparatus 100, the optical touch screen apparatus 100 may be controllable by irradiating light from the light source device 150. If a user is located adjacent to the optical touch screen apparatus 100, the optical touch screen apparatus 100 may be controllable by directly touching the optical touch screen apparatus 100 with the user's finger and/or a pen. In the case of the optical touch screen apparatus 100, the remote touch by using the light source device 150 and the direct touch by using a user's finger and/or pen may be simultaneously performed.

In the sensing pixel 110 of FIG. 4, the light sensing pixel 110p and the touch sensing pixel 110t may be connected to the common data line Data. However, the light sensing pixel 110p and the touch sensing pixel 110t may be connected to different data lines.

Figure 5:
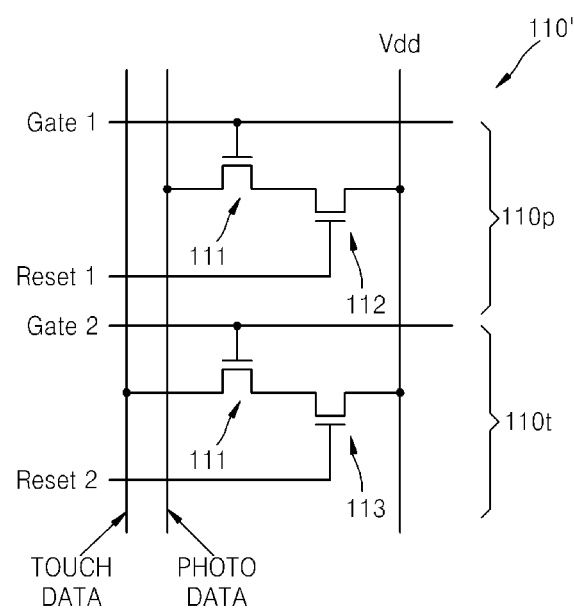

FIG. 5 is a circuit diagram illustrating sensing pixels 110' of optical touch screen apparatuses in which the light sensing pixel 110p and the touch sensing pixel 110t may be connected to different data lines. Referring to FIG. 5, the source of a switch transistor 111 of a light sensing pixel 110p may be connected to a light-sensing data line Photo Data and the source of a switch transistor 111 of a touch sensing pixel 110t may be connected to a touch-sensing data line Touch Data. In general, intensity of display light reflected by a finger and/or a pen may be lower than that of light incident from a light source device 150. As a result, a drain current of the second light sensor transistor 113 may be lower than that of the first light sensor transistor 112. The touch-sensing data line Touch Data may be connected to a noise compensation circuit and an amplification circuit (not shown) to remove noise of a signal output by the touch sensing pixel 110t and amplify the intensity of the signal. The structure and operation of the sensing pixel 110' illustrated in FIG. 5 is the same as the structure and operation of the sensing pixel 110 except that the number of data lines may be two.

The first light sensor transistor 112 of the light sensing pixel 110p and the second light sensor transistor 113 of the touch sensing pixel 110t are described as being highly sensitive to different wavelength bands of light. However, if there is no need to distinguish remote light sensing by irradiation of external light and touch sensing by direct touch, the first light sensor transistor 112 and the second light sensor transistor 113 may sense the same wavelength band of light. In this case, structures of the first light sensor transistor 112 and the second light sensor transistor 113 may be the same. The channel layers of the first light sensor transistor 112 and the second light sensor transistor 113 may be configured with the same structure and components. All of the sensing pixels 110 and 110' of the optical touch screen apparatus 100 may perform both remote light sensing and touch light sensing without distinction between the light sensing pixel 110p and the touch sensing pixel 110t.

An optical touch screen apparatus 100 may be embodied as, for example, a thin, transparent film attached to a surface of a display panel. According to at least one example embodiment, an optical touch screen apparatus 100 may instead be embodied as an in-cell type optical touch screen apparatus in which a display pixel and a sensing pixel may be integrally formed as one body.

Figure 9:
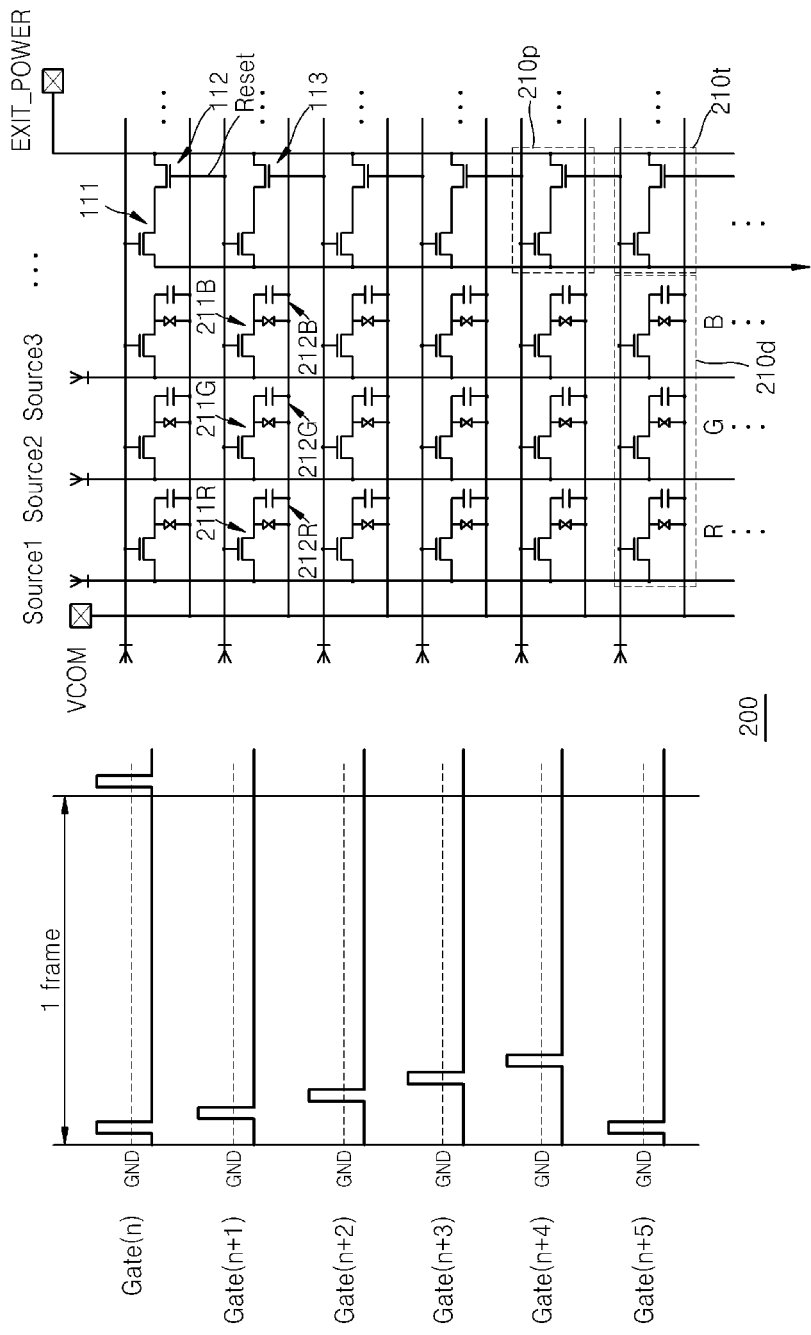

FIG. 9 is a circuit diagram illustrating in-cell type optical touch screen apparatus pixel arrays according to at least one example embodiment. Referring to FIG. 9, an in-cell type optical touch screen apparatus 200 may include a plurality of display pixels 210d aligned along a plurality of rows and a plurality of columns. In FIG. 9, for ease of description, display pixels 210d may be illustrated in rows of one column but example embodiments are not so limited. Each of the display pixels 210d may include a red sub-pixel R, a green sub-pixel G, and a blue sub-pixel B. The sub-pixels R, G, and B may include display cells (for example, in the case of an LCD, liquid crystal cells) 212R, 212G, and 212B and switch transistors 211R, 211G, and 211B for controlling on/off of the display cells 212R, 212G, and 212B, respectively. In the display pixel 210d, gates of switch transistors 211R, 211G, and 211B may be connected to a common gate line. Drains of the switch transistors 211R, 211G, and 211B may be respectively connected to different image data lines Source 1, Source 2, and Source 3. Sources of the switch transistors 211R, 211G, and 211B may be respectively connected to display cells 212R, 212G, and 212B.

An in-cell type optical touch screen apparatus 200 may include a plurality of light sensing pixels 210p and a plurality of touch sensing pixels 210t which alternate in a column direction adjacent to the display pixels 210d. For example, as illustrated in FIG. 9, in n, n+2, and n+4$^{th}$ rows, the light sensing pixel 210p may be adjacent to the display pixel 210d, and in n+1, n+3, and n+5$^{th}$ rows, the touch sensing pixel 210t may be disposed adjacent to the display pixel 210d. The light sensing pixel 210p and the touch sensing pixel 210t may be integrated with the display pixel 210d on the same substrate in an in-cell type apparatus. For example, the gate of the switch transistor 111 of the light sensing pixel 210p and/or the touch sensing pixel 210t arranged in a row may be connected to a gate line together with gates of the switch transistors 211R, 211G, and 211B in the same row. If, for example, a gate voltage is applied to a gate line Gate (n) in an n$^{th}$ row, the switch transistors 211R, 211G, and 211B of the display pixel 210d and the switch transistor 111 of the light sensing pixel 210p in the $n^{th}$ row may be turned ON simultaneously. When a gate voltage is applied to a gate line Gate (n+1) in an $n+1^{th}$ row, the switch transistors 211R, 211G, and 211B of the display pixel 210d in the $n+1^{th}$ row and the switch transistor 111 of the touch sensing pixel 210t may be turned ON simultaneously.

The structure and operation of the light sensing pixel 210p and the touch sensing pixel 210t may be the same as those of the light sensing pixel 110p and the touch sensing pixel 110t described with reference to FIG. 4. For example, the first light sensor transistor 112 of the light sensing pixel 210p may be highly sensitive to a relatively short wavelength of a green, blue, or UV light. The second light sensor transistor 113 of the touch sensing pixel 110t may be highly sensitive to a relatively long wavelength of red and/or IR light. According to at least one example embodiment, the first light sensor transistor 112 and the second light sensor transistor 113 may be oxide semiconductor transistors of a same structure that senses a same spectrum of light.

According to example embodiments, a reset line Reset for providing a reset signal to reset the first and second light sensor transistors 112 and 113, as illustrated in FIG. 9, may be between gates of the first and second light sensor transistors 112 and 113 and a gate line in a subsequent row. For example, the gate of the first light sensor transistor 112 included in the light sensing pixel 210p in an $n^{th}$ row may be connected to an $n+1^{th}$ gate line Gate (n+1) via a reset line Reset. The gate of the second light sensor transistor 113 may be included in the touch sensing pixel 210t in the $n+1^{th}$ row and may be connected to an $n+2^{th}$ gate line Gate (n+2) via a reset line Reset. In this case, a separate driving circuit may not be required to sequentially provide a reset signal to the first and second light sensor transistors 112 and 113. One gate driver (not shown) that may sequentially apply a gate signal to the respective gate lines may perform a reset operation of the first and second light sensor transistors 112 and 113. The structure of the optical touch screen apparatus 200 may be simplified, and improved specialized utilization, lower process costs, and lower power consumption may be obtained.

Referring to the timing diagram on the left side of FIG. 9, by applying a HIGH voltage (that is, a voltage equal to or greater than a threshold voltage of the switch transistors 211R, 211G, 211B, and 111) to the $n^{th}$ gate line Gate (n), the display pixel 210d in the $n^{th}$ row displays an image and simultaneously, the light sensing pixel 210p may output a light sensing signal. A LOW voltage may be applied to the other gate lines. In this case, a LOW voltage may also be applied to the gate of the first light sensor transistor 112 in the $n^{th}$ row that may be connected to the $n+1^{th}$ gate line Gate (n+1) via the reset line Reset. The LOW voltage may be, for example, a voltage that may be lower than a threshold voltage of the first light sensor transistor 112.

A HIGH voltage may be applied to the $n+1^{th}$ gate line Gate (n+1) so that the display pixel 210d in the $n+1^{th}$ row may display an image and simultaneously, the touch sensing pixel 210t may output a touch sensing signal. A LOW voltage may be applied to the other gate lines. A HIGH voltage may be also applied to the gate of the first light sensor transistor 112 in the $n^{th}$ row that may be connected to the n+1 th gate line Gate (n+1) via the reset line Reset. The HIGH voltage may be a voltage that may be sufficiently high to reset the first light sensor transistor 112. The HIGH voltage may be the highest of threshold voltages of the switch transistors 211R, 211G, 211B, and 111 and a voltage for resetting the first light sensor transistor 112. While the touch sensing pixels 210t in the $n+1^{th}$ row may output a touch sensing signal, the first light sensor transistors 112 in the light sensing pixels 210p in the $n^{th}$ row may be reset. While a signal is output by the light sensing pixel 210p or the touch sensing pixel 210t in the same row, the first and second light sensor transistors 112 and 113 that may be arranged in the previous row may be reset.

Figure 10:
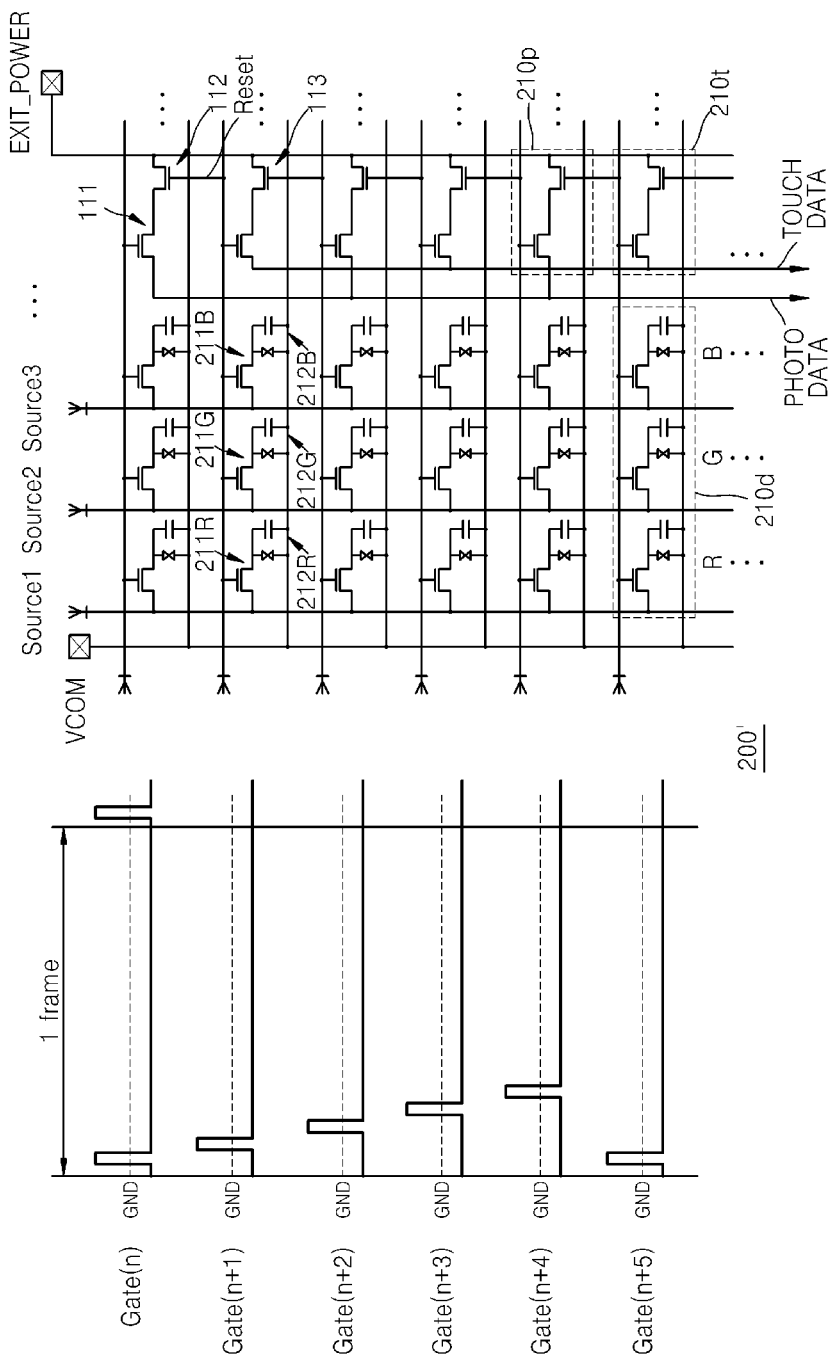

FIG. 10 is a circuit diagram illustrating in-cell type optical touch screen apparatus pixel arrays according to at least one other example embodiment. FIG. 10 illustrates an optical touch screen apparatus 200' in which the light sensing pixel 210p and the touch sensing pixel 210t may be connected to different data lines. Referring to FIG. 10, the source of the switch transistor 111 of the light sensing pixel 210p may be connected to a light-sensing data line Photo Data and the source of the switch transistor 111 of the touch sensing pixel 210t may be connected to a touch-sensing data line Touch Data. As illustrated in FIG. 5, the touch-sensing data line Touch Data may be connected to a noise compensation circuit and an amplification circuit (not shown) to remove noise of a signal output by the touch sensing pixel 110t and may amplify the intensity of the signal. The structure and operation of the optical touch screen apparatus 200' illustrated in FIG. 10 are the same as those of the optical touch screen apparatus 200 illustrated in FIG. 9, except that the number of data lines is two.

While example embodiments have been particularly shown and described, it will be understood by one of ordinary skill in the art that variations in form and detail may be made therein without departing from the spirit and scope of the claims.

What is claimed is:

1. An optical touch screen apparatus, comprising:
   a plurality of sensing pixels in a plurality of rows and a plurality of columns, each of the sensing pixels including
   a light sensing pixel configured to sense light, the light sensing pixel including a first light sensor transistor and a first switch transistor connected in series, and
   a touch sensing pixel configured to sense light, the touch sensing pixel including a second light sensor transistor and a second switch transistor connected in series,
   wherein each of the light sensing pixels is configured to sense light received from an external light source, and each of the touch sensing pixels is configured to sense light reflected by a screen touch object.

2. The optical touch screen apparatus of claim 1, wherein the light sensing pixels and the touch sensing pixels alternate in a column direction.

3. The optical touch screen apparatus of claim 1, further comprising:
   a first gate line connected to a gate of at least one of the first switch transistors;
   a first reset line connected to a gate of at least one of the first light sensor transistors;
   a second gate line connected to a gate of at least one of the second switch transistors; and
   a second reset line connected to a gate of at least one of the second light sensor transistors,
   wherein the at least one of the first switch transistors, the at least one of the first light sensor transistors, the at least one of the second switch transistors and the at least one of the second light sensor transistors are part of a first sensing pixel of the plurality of sensing pixels.

4. The optical touch screen apparatus of claim 3, wherein the second gate line and the first reset line are a same signal line.

5. The optical touch screen apparatus of claim 3, further comprising:

a data line commonly connected to sources of the at least one of the first switch transistors and the at least one of the second switch transistors.

6. The optical touch screen apparatus of claim 3, further comprising:
a first data line connected to a source of the at least one of the first switch transistors; and
a second data line connected to a source of the at least one of the second switch transistors.

7. The optical touch screen apparatus of claim 3, further comprising:
a third gate line connected to a second sensing pixel of the plurality of sensing pixels,
wherein the at least one of the first light sensor transistors, the first gate line, and the first reset line are in a first row of the plurality of rows,
the at least one of the second light sensor transistors, the second gate line and the second reset line are in a second row of the plurality of rows,
the first reset line is between the gate of the at least one of the first light sensor transistors and the second gate line, and
the second reset line is between the gate of the at least one of the second light sensor transistors and the third gate line.

8. The optical touch screen apparatus of claim 1, wherein
the first light sensor transistors are first oxide semiconductor transistors configured to sense a first spectrum of light,
the second light sensor transistors are second oxide semiconductor transistors configured to sense a second spectrum of light,
a sensitivity of the first light sensor transistors to the first spectrum of light is greater than a sensitivity of the second light sensor transistors to the first spectrum of light, and
a sensitivity of the first light sensor transistors to the second spectrum of light is less than a sensitivity of the second light sensor transistors to the second spectrum of light.

9. The optical touch screen apparatus of claim 8, wherein an average wavelength of light in the first spectrum is greater than an average wavelength of light in the second spectrum.

10. The optical touch screen apparatus of claim 9, wherein
the first spectrum of light comprises at least one spectrum of the group consisting of green, blue, and ultraviolet spectrums, and
the second spectrum of light comprises at least one spectrum of the group consisting of red and infra-red spectrums.

11. The optical touch screen apparatus of claim 1, wherein the first light sensor transistors and the second light sensor transistors are oxide semiconductor transistors configured to sense a same spectrum of light.

12. An optical touch screen apparatus, comprising: a plurality of sensing pixels in a plurality of rows and a plurality of columns,
each of the sensing pixels including a light sensing pixel configured to sense light, the light sensing pixel including a first light sensor transistor and a first switch transistor connected in series, and
a touch sensing pixel configured to sense light, the touch sensing pixel including a second light sensor transistor and a second switch transistor connected in series; and
a plurality of display pixels arranged in the plurality of rows and the plurality of columns, each of the display pixels including a display cell and a third switch transistor for controlling ON/OFF of the display cell,
wherein each of the light sensing pixels are configured to sense light received from an external light source, and each of the touch sensing pixels are configured to sense light reflected by a screen touch object.

13. The optical touch screen apparatus of claim 12, wherein
the display pixels are in a row direction, and
the light sensing pixels and the touch sensing pixels are adjacent to corresponding display pixels.

14. The optical touch screen apparatus of claim 13, wherein the light sensing pixels and the touch sensing pixels alternate in the row direction.

15. The optical touch screen apparatus of claim 12, further comprising:
a first gate line connected to a gate of at least one of the first switch transistors and a gate of at least one of the third switch transistors;
a first reset line connected to a gate of at least one of the first light sensor transistors;
a second gate line connected to a gate of at least one of the second switch transistors and the gate of at least one of the third switch transistors; and
at least one second reset line connected to a gate of at least one of the second light sensor transistors.

16. The optical touch screen apparatus of claim 15, further comprising:
a data line commonly connected to sources of the at least one of the first switch transistors and the at least one of the second switch transistors.

17. The optical touch screen apparatus of claim 15, further comprising:
a first data line connected to a source of the at least one of the first switch transistors, and
a second data line connected to a source of the at least one of the second switch transistors.

18. The optical touch screen apparatus of claim 15, wherein
the first reset line is between the gate of the at least one of the first light sensor transistors in a first row and the second gate line in a second row, and
the second reset line is between the gate of the second light sensor transistor in the second row and a gate line of a third row.

19. The optical touch screen apparatus of claim 15, further comprising:
an image data line connected to a drain of the third switch transistor,
wherein the display cell is connected to a source of the third switch transistor.

20. The optical touch screen apparatus of claim 12, wherein
the first light sensor transistors are first oxide semiconductor transistors configured to sense a first spectrum of light,
the second light sensor transistors are second oxide semiconductor transistors configured to sense a second spectrum of light, and
a sensitivity of the first light sensor transistors to the first spectrum of light is greater than a sensitivity of the second light sensor transistors to the first spectrum of light.

21. The optical touch screen apparatus of claim 20, wherein an average wavelength of light in the first spectrum is greater than an average wavelength of light in the second spectrum.

22. The optical touch screen apparatus of claim 21, wherein
the first spectrum of light comprises at least one spectrum of the group consisting of green, blue, and ultraviolet spectrums, and the second spectrum of light comprises at least one spectrum of the group consisting of red and infra-red spectrums.

23. The optical touch screen apparatus of claim 12, wherein the first light sensor transistors and the second light sensor transistors are oxide semiconductor transistors configured to sense a same spectrum of light.

24. An optical touch screen apparatus, comprising:
a light sensing pixel associated with a first oxide semiconductor thin film transistor (TFT) including a first oxide semiconductor material with sensitivity to a first spectrum of light, and
a touch sensing pixel associated with a second oxide semiconductor TFT including a second oxide semiconductor with sensitivity to a second spectrum of light, the second spectrum being different from the first spectrum,
wherein the first oxide TFT is configured to sense light received from an external light source, and the second oxide TFT is configured to sense light reflected by a screen touch object, and a source of the first oxide TFT is connected to a drain of a first switch transistor, and a source of the second oxide TFT is connected to a drain of a second switch transistor.

25. The optical touch screen apparatus of claim 24, wherein the first spectrum is at least one of green, blue, and ultra-violet spectrums, and
the second spectrum is at least one of red and infra-red spectrums.

26. The optical touch screen apparatus of claim 25, wherein the optical touch screen apparatus is configured to use the second oxide semiconductor TFT as a touch sensor and the first oxide semiconductor TFT as a light source sensor.

* * * * *